United States Patent
Ito et al.

(10) Patent No.: US 7,382,024 B2
(45) Date of Patent: *Jun. 3, 2008

(54) LOW THRESHOLD VOLTAGE PMOS APPARATUS AND METHOD OF FABRICATING THE SAME

(75) Inventors: Akira Ito, Irvine, CA (US); Henry K Chen, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/648,651

(22) Filed: Jan. 3, 2007

(65) Prior Publication Data

US 2007/0108524 A1  May 17, 2007

Related U.S. Application Data

(63) Continuation of application No. 10/911,720, filed on Aug. 5, 2004, now Pat. No. 7,161,213.

(51) Int. Cl.
*H01L 27/01* (2006.01)
*H01L 21/00* (2006.01)
*H01L 21/338* (2006.01)

(52) U.S. Cl. ............... 257/349; 438/156; 438/173
(58) Field of Classification Search ........ 438/156, 438/173, 227–228; 257/276, 289, 327, 349, 257/362, 376

See application file for complete search history.

(56) References Cited

U.S. PATENT DOCUMENTS

| | | | |
|---|---|---|---|
| 6,114,729 | A | 9/2000 | Park et al. |
| 6,118,158 | A | 9/2000 | Kim |
| 6,514,810 | B1 | 2/2003 | Kim et al. |
| 6,700,176 | B2 | 3/2004 | Ito et al. |
| 6,875,650 | B2 | 4/2005 | Salling et al. |
| 6,902,958 | B2 | 6/2005 | Ito et al. |
| 6,985,387 | B2 | 1/2006 | Chen et al. |
| 7,161,213 | B2 | 1/2007 | Ito et al. |

OTHER PUBLICATIONS

Degraeve et al., "Relation Between Breakdown Mode and Location in Short-Channel nMOSFETs and Its Impact on Reliability Specifications," *IEEE Transactions on Device and Materials Reliability*, vol. 1, No. 3, Sep. 2001, pp. 163-169.

*Primary Examiner*—Calvin Lee
(74) *Attorney, Agent, or Firm*—Sterne, Kessler, Goldstein & Fox PLLC (57) ABSTRACT

A P-type metal oxide semiconductor (PMOS) device can include an N-well that does not extend completely throughout the active region of the PMOS device. For example, the PMOS device can be fabricated using a masking step to provide an N-well having an inner perimeter and an outer perimeter. The inner perimeter of the N-well surrounds at least a portion of the active region of the PMOS device. According to an embodiment, the inner perimeter of the N-well surrounds the entire active region. The PMOS device can include a deep N-well in contact with the N-well.

13 Claims, 10 Drawing Sheets

FIG. 10

LOW THRESHOLD VOLTAGE PMOS APPARATUS AND METHOD OF FABRICATING THE SAME

CROSS REFERENCE TO RELATED APPLICATIONS

This application is a continuation of U.S. patent application Ser. No. 10/911,720, filed Aug. 5, 2004, now U.S. Pat. No. 7,161,213, which is incorporated herein by reference in its entirety.

BACKGROUND OF THE INVENTION

1. Field of the Invention

The present invention generally relates to semiconductors, and more specifically to PMOS technology.

2. Background

A semiconductor device is generally fabricated by performing operations on a semiconductor substrate to provide certain electrical characteristics. These operations can include deposition, diffusion, etching, ion implantation, lithography, and oxidation, to provide some examples.

The semiconductor substrate is typically formed of silicon (Si) and can be either N-type or P-type. An N-type substrate is generally doped with phosphorus atoms (e.g., phosphorus atoms are implanted into, or otherwise added to, the substrate) to provide excess electrons that can be mobilized by applying a voltage to the substrate. A P-type substrate is generally doped with boron atoms to provide excess holes that can be mobilized. Excess electrons or holes are commonly referred to as excess carriers.

A P-type metal oxide semiconductor field effect transistor (PMOSFET), for example, can be fabricated by implanting phosphorus atoms into a P-type substrate to create an N-well. P+ regions are formed in the N-well to provide source and drain regions. The "+" indicates that the region is doped with a higher carrier concentration than a region not designated by a "+". For instance, the P+ regions typically have a greater number of excess holes than the P-type substrate. An N+ region generally has a greater number of excess electrons than an N-type region.

A gate is located (typically on an oxide layer, called a "gate oxide") between the source and the drain to control the on/off state of the PMOSFET. The PMOSFET is generally turned on when the voltage applied to the gate goes below a threshold. The threshold voltage of a conventional PMOSFET is negative, and the magnitude of this negative threshold voltage is too great for the PMOSFET to be used in some applications.

What is needed is a low threshold voltage PMOS apparatus and method that addresses one or more of the aforementioned shortcomings of conventional PMOSFET devices and methods.

BRIEF SUMMARY OF THE INVENTION

The present invention provides a P-type metal oxide semiconductor (PMOS) device and method of fabricating the same. The PMOS device includes an N-well that does not extend completely throughout the active region of the PMOS device. The PMOS device can be fabricated using a masking step to hinder carriers from being implanted completely throughout the active region. The PMOS device can include a deep N-well. For instance, the deep N-well can be in contact with the N-well.

BRIEF DESCRIPTION OF THE DRAWINGS/FIGURES

The present invention is described with reference to the accompanying drawings. In the drawings, like reference numbers indicate identical or functionally similar elements. Additionally, the left most digit(s) of a reference number identifies the drawing in which the reference number first appears.

DETAILED DESCRIPTION OF THE INVENTION

Figure 1:
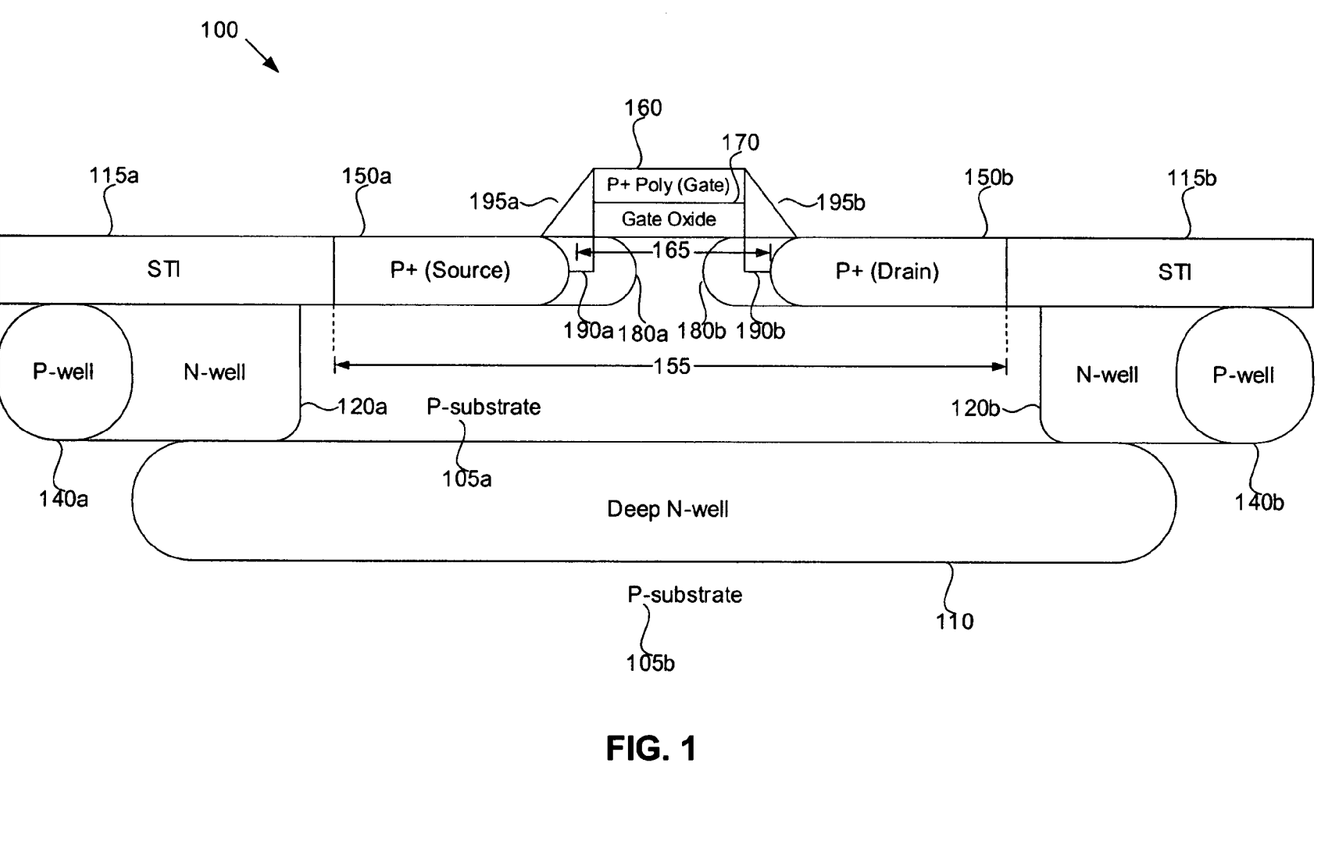
FIG. 1 illustrates a cross-sectional view of a native P-type metal oxide semiconductor (PMOS) structure according to an embodiment of the present invention.

FIG. 1 illustrates a cross-sectional view of a native P-type metal oxide semiconductor (PMOS) structure 100 according to an embodiment of the present invention. The native PMOS structure 100 includes a P-type substrate 105a and 105b (hereinafter 105). A deep N-well 110 and N-wells 120a and 120b (hereinafter 120) provide isolation for the native PMOS structure 100. Although the N-wells 120 are depicted as two separate N-wells in the cross-sectional representation of FIG. 1, the N-wells 120 generally represent a single, concentric N-well. The native PMOS structure 100 can include any suitable number of N-wells.

The deep N-well 110 and/or the N-wells 120 can prevent or hinder any parasitic effects between the PMOS structure 100 and any adjacent structures. Atoms in the deep N-well 110 and/or the N-wells 120 can form bonds with carriers as the carriers migrate from one structure toward another. The deep N-well 110 can electrically isolate the P-substrate 105a and the P-substrate 105b from each other. For instance, the deep N-well 110 can provide electrical isolation in the vertical direction with respect to the two-dimensional representation of the native PMOS structure 100 in FIG. 1.

Shallow trench isolation (STI) regions 115a and 115b (hereinafter 115) can provide isolation and protection for the native PMOS structure 100. For instance, the STI regions 115 can provide isolation in the lateral direction with respect to the two-dimensional representation of the native PMOS structure 100 in FIG. 1. The STI regions 115 are generally formed of a dielectric material (e.g., $SiO_2$), though any suitable material can be used. For instance, bipolar technologies sometimes use polysilicon, rather than $SiO_2$.

According to an embodiment, the native PMOS structure 100 is part of a complementary metal oxide semiconductor (CMOS) structure. In a CMOS structure, PMOS and N-type metal oxide semiconductor (NMOS) structures are electrically coupled, such that the combination of PMOS and NMOS structures typically uses less power than PMOS or NMOS structures operating independently. An N-well 120 can isolate the native PMOS structure 100 from an adjacent NMOS structure (not shown), for example. In bipolar CMOS (BiCMOS) implementations, for example, an N-epi layer and an N+ subcollector region can be used, rather than the P-substrate 105 and the deep N-well 110.

P+ region 150a represents a source of the native PMOS structure 100, and P+ region 150b represents a drain. The region between the outer edges of the source 150a and the drain 150b, or the edges of the STI regions 115, is commonly referred to as the "active region" 155. The carriers flow within the active region between the source 150a and the drain 150b in the channel 165. The length of the channel 165 is defined by the length of a P+ polysilicon (P+ Poly) layer 160, as shown in FIG. 1.

The P+ Poly layer 160 represents a gate of the native PMOS structure 100. The gate 160 is capable of turning the native PMOS structure 100 "on" or "off". For example, a negative voltage at the gate 160 turns the native PMOS structure 100 "on". In this example, a negative voltage applied to the gate 160 allows current to flow from the source 150a to the drain 150b. According to an embodiment, a positive voltage or a ground potential at the gate 160 turns the native PMOS structure 100 "off". For instance, applying a positive voltage at the gate 160 substantially prevents current from flowing from the source 150a to the drain 150b. According to an embodiment, the native PMOS structure 100 has a higher drive current than a conventional PMOS device.

A gate oxide layer 170 prevents the gate 160 from shorting with the source 150a and/or the drain 150b. For instance, carriers from the gate 160, the source 150a, and/or the drain 150b typically form bonds with other atoms in the gate oxide layer 170, rather than penetrating the gate oxide layer 170. The gate oxide layer 170 acts as a barrier to carriers that flow from the gate 160 toward the source 150a or the drain 150b, and vice versa.

A thin gate oxide layer 170 generally allows the native PMOS structure 100 to switch more quickly. For example, a shorter distance between the gate 160 and the channel 165 enables the current flowing from the source 150a to the drain 150b to be turned "on" or "off" more quickly in response to a change of voltage at the gate 160.

According to an embodiment, a voltage at the gate 160 generates an electric field, which depletes the channel 165 or a portion of the channel 165 of free carriers. The region of the channel 165 that is depleted of free carriers is referred to as the depletion region of the native PMOS structure 100. If a negative voltage is applied to the gate 160, for example, the depletion region spreads in the channel 165 from the drain 150b toward the source 150a. If the depletion region reaches the source 150a, then "punchthrough" occurs. For instance, the gate 160 may no longer be able to control the current from the source 150a to the drain 150b.

A voltage need not be applied to the gate 160 in order for punchthrough to occur. A voltage at the source 150a or the drain 150b can cause punchthrough. For instance, a positive voltage at the drain 150b can pull electrons across the channel 165 from the source 150a to the drain 150b.

Halo implant regions 180a and 180b (hereinafter 180) are included to prevent punchthrough. For example, the halo implant regions 180 can hinder the depletion region from reaching the source 150a when the depletion region extends through the channel 165. The halo implant regions 180 can be doped with phosphorus atoms or arsenic atoms, to provide some examples. The halo implant regions 180 are typically doped slightly more heavily than the N-wells 120. Deep submicron PMOS devices often include halo implant regions 180, also referred to as "pockets".

P-type lightly doped drain (P-LDD) regions 190a and 190b (hereinafter 190) are included to reduce the influence of the channel length on the threshold voltage of the native PMOS structure 100. For instance, the P-LDD regions 190 can enable the threshold voltage to be fairly consistent over a range of channel lengths. Spacers 195 are included at the ends of the gate 160. The spacers 195 are typically a dielectric material, such as $SiO_2$. The spacers 195 can facilitate formation of the P-LDD regions 190 and the halo implant regions 180.

Figure 2:
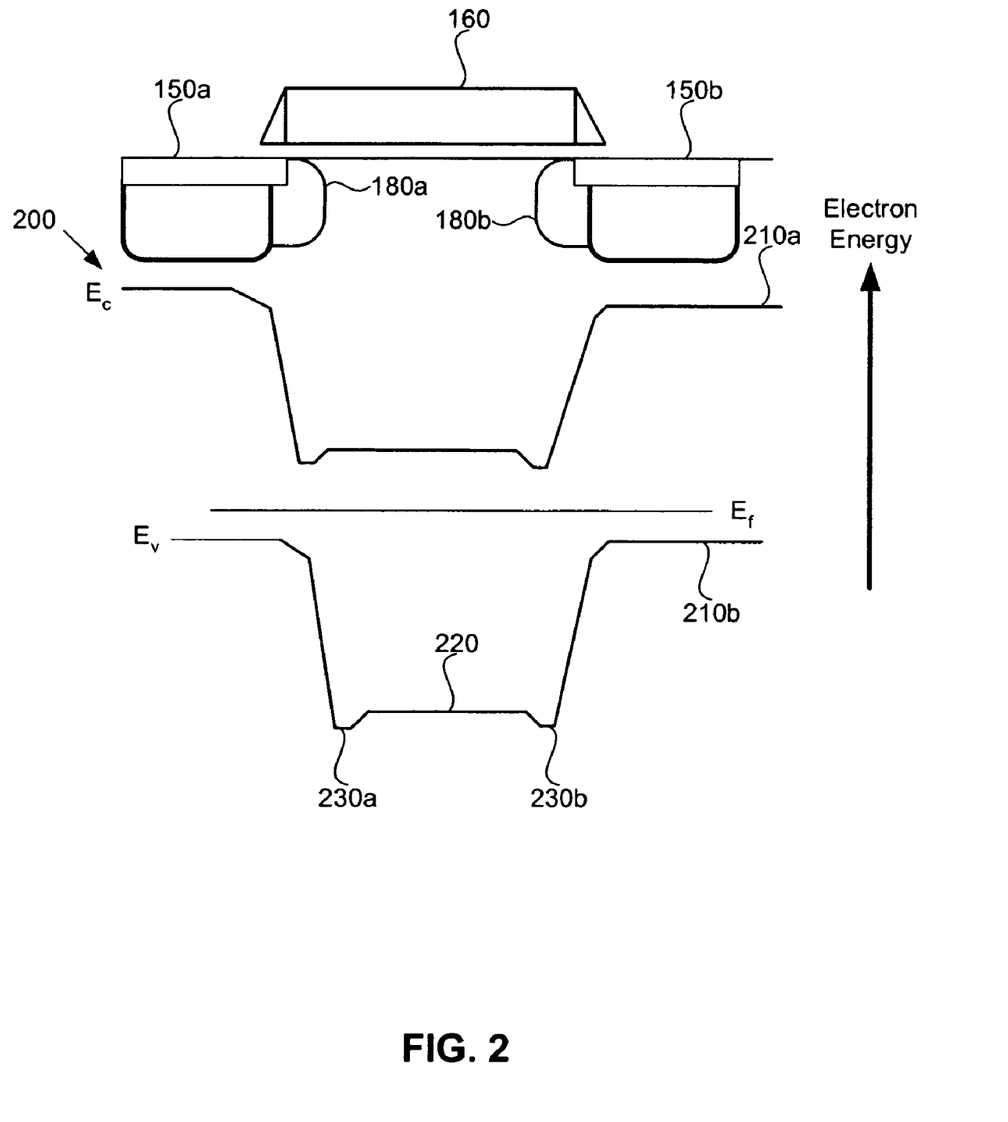
FIG. 2 illustrates a horizontal energy band diagram according to an embodiment of the present invention.

FIG. 2 illustrates a horizontal energy band diagram 200 according to an embodiment of the present invention. The horizontal energy band diagram 200 includes a conduction energy band ($E_c$) 210a and a valence energy band ($E_V$) 210b between the source 150a and the drain 150b. The fermi energy level ($E_f$) is the energy level having a fifty percent probability of being filled with a carrier at equilibrium.

In FIG. 2, the energy band 210b is at a higher electron energy at point 220 as compared to points 230 because the halo implant regions 180 increase the barriers at points 230. A higher barrier generally allows fewer carriers to pass. For example, the halo implant regions 180 can reduce the leakage current between the source 150a and the drain 150b.

Figure 3:
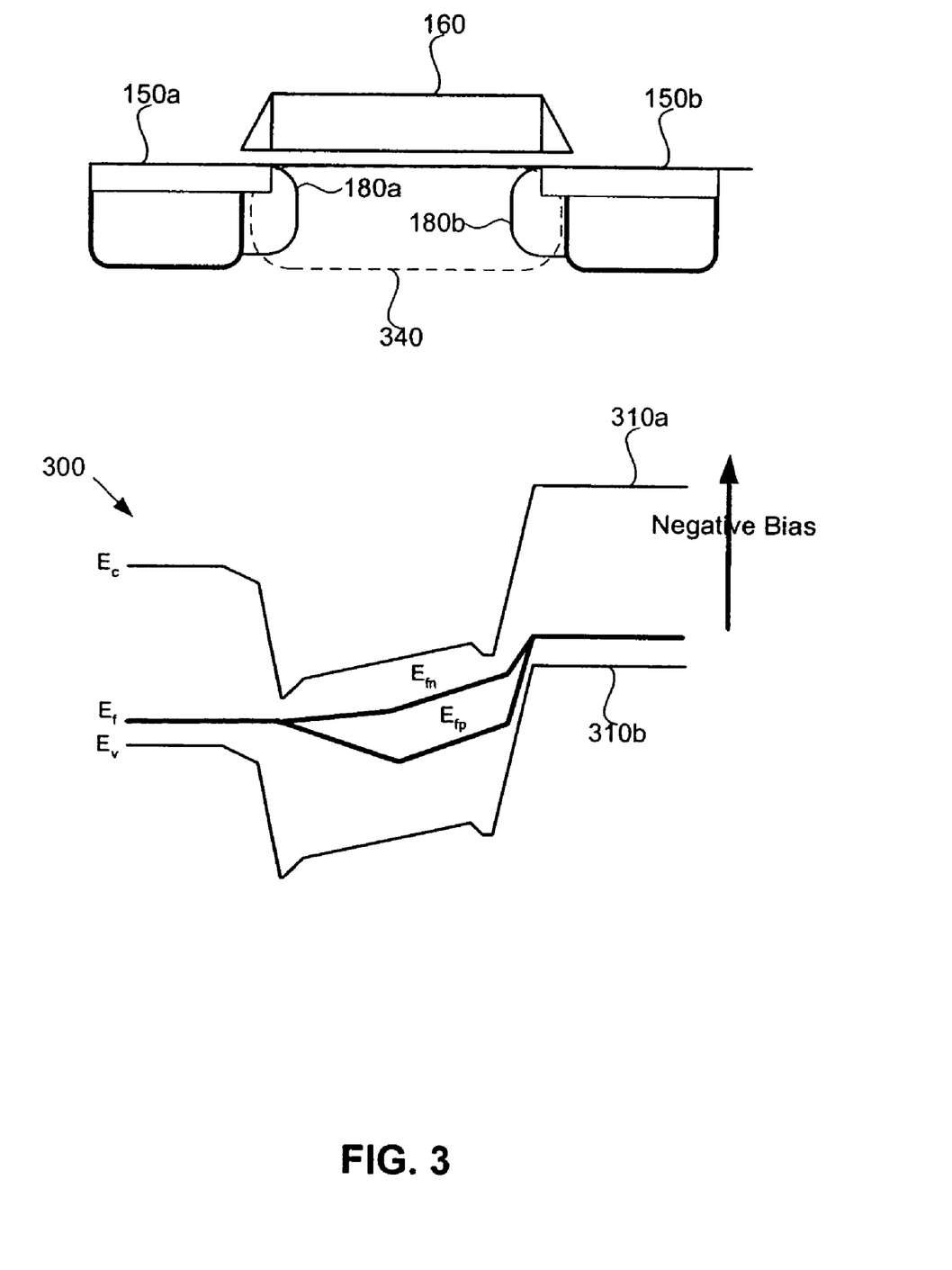
FIG. 3 illustrates a horizontal energy band diagram depicting punchthrough according to an embodiment of the present invention.

FIG. 3 illustrates a horizontal energy band diagram 300 depicting punchthrough according to an embodiment of the present invention. In FIG. 3, the source 150a is biased to ground for illustrative purposes. The drain 150b is negatively biased, such that the depletion region 340 extends from the drain 150b and touches the source 150a. The energy bands 310 shift in response to the depletion region contacting the source 150a, and holes are allowed to pass from the source 150a to the drain 150b.

In a non-equilibrium condition, the Fermi energy level $E_f$ differs for electrons and holes, resulting in an electron quasi-Fermi level ($E_{fn}$) and a hole quasi-Fermi level ($E_{fp}$). As shown in FIG. 3, negatively biasing the drain 150b creates a non-equilibrium condition, which shifts the energy bands $E_C$, $E_V$, and $E_f$ of the energy band diagram 300. The difference between $E_{fn}$ and $E_{fp}$ is directly proportional to the bias voltage (V) applied to the drain 150b. This difference is represented by the equation $E_{fn} - E_{fp} = q_e V$, where $q_e$, is the charge of an electron.

Referring back to FIG. 1, in absence of punchthrough, the magnitude of the voltage at the gate generally must exceed a threshold voltage of the native PMOS structure to allow carriers, such as holes or electrons, to flow from the source to the drain, or vice versa. According to an embodiment, the native PMOS structure 100 has a positive threshold voltage. For example, the threshold voltage can be approximately +300 mV to +500 mV. In this example, the native PMOS structure 100 can turn "on" in response to the gate voltage going below approximately +300 mV to +500 mV.

Figure 4:
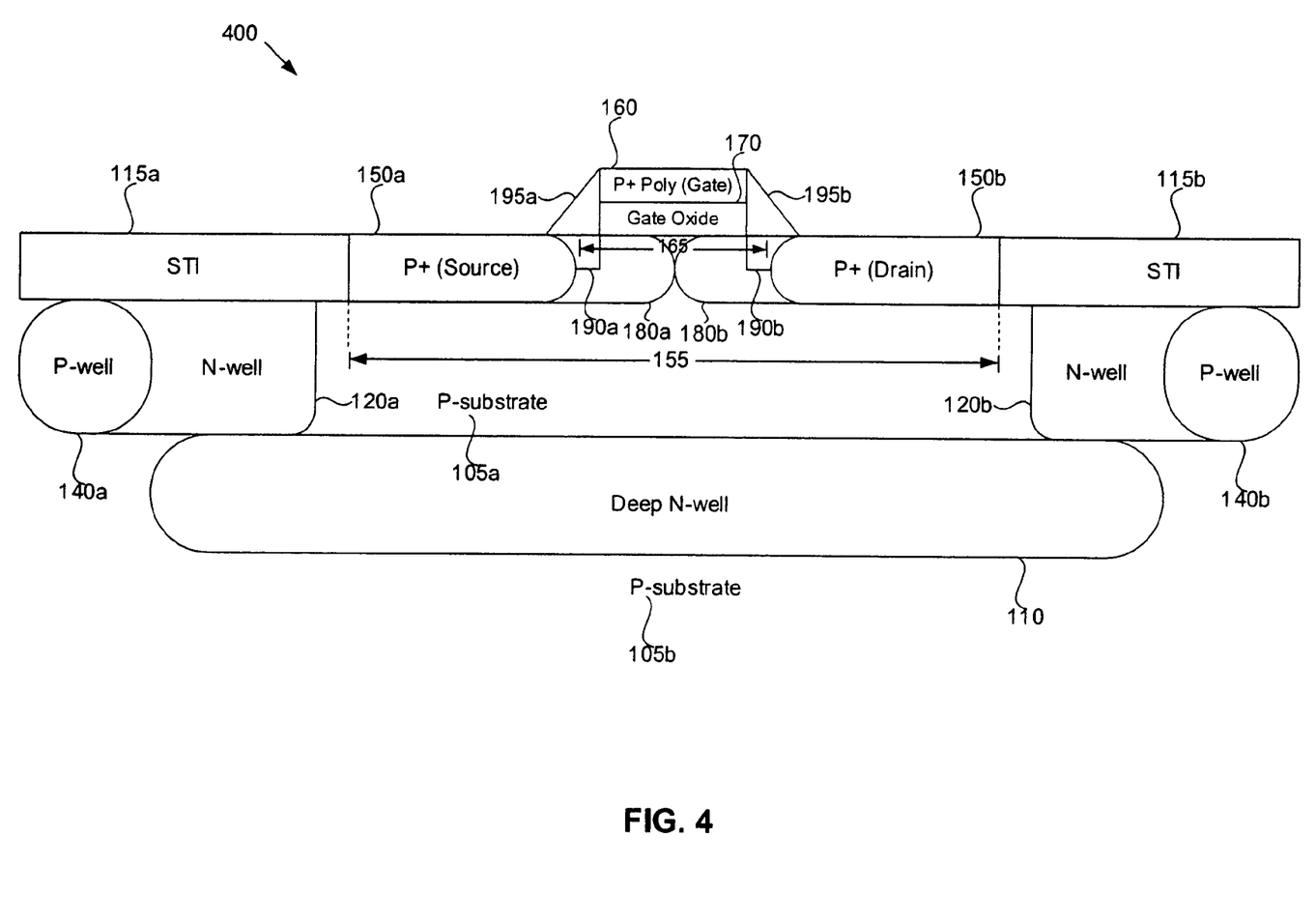
FIG. 4 illustrates a cross-sectional view of a short channel native P-type metal oxide semiconductor (PMOS) structure according to an embodiment of the present invention.

The threshold voltage is based on characteristics of the native PMOS structure 100. For example, the distance between the halo implant regions 180 is generally directly proportional to the threshold voltage of the native PMOS structure 100. Referring to the embodiment of FIG. 4, the halo implant regions 180 can touch each other. For instance, the halo implant regions 180 can combine to form a single halo region. The combined halo implant region can provide the same function as an N-well of a conventional PMOS device. In FIG. 4, the native PMOS structure 400 can have a threshold voltage of approximately zero volts.

According to an embodiment, the channel length of the native PMOS structure 100, 400 affects the threshold voltage of the native PMOS structure 100, 400. For example, a shorter channel length may necessitate that the halo implant regions 180 be closer together.

The P-type lightly doped drain (P-LDD) regions 190 can reduce the effect that the distance between the halo implant regions 180 has on the threshold voltage. For example, the P-LDD regions 190 can reduce the electric field at the drain 150b. A lower electric field at the drain 150b can be less likely to influence the threshold voltage.

The junction depths of the source 150a and the drain 150b can affect the degree to which the distance between the halo implant regions 180 impacts the threshold voltage. Deeper source and drain junction depths (e.g., approximately 200 nm or greater) can increase the likelihood that the threshold voltage varies across a range of channel lengths. According to an embodiment, shallow junction depths (e.g., approximately 50-100 nm) can provide a threshold voltage that is relatively constant over a range of channel lengths.

Figure 5:
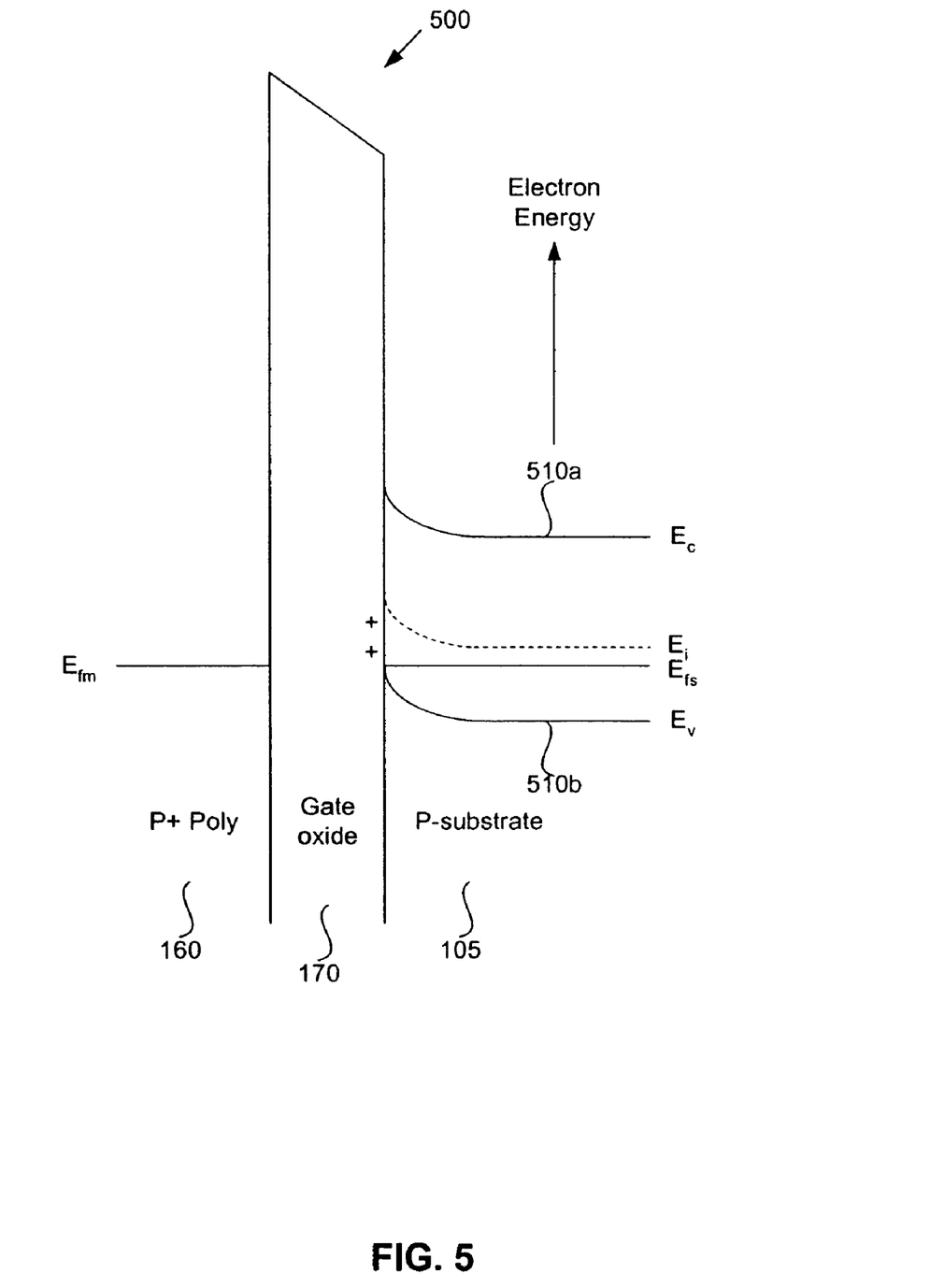
FIG. 5 illustrates a vertical energy band diagram according to an embodiment of the present invention.

Turning now to FIG. 5, a vertical energy band diagram 500 represents energy bands 510 of the gate 160 and the P-substrate 105. In FIG. 5, the native PMOS structure 100, 400 is at equilibrium. No voltage is applied at the gate 160. The voltage at the gate 160 is approximately zero. $E_C$ and $E_V$ represent the edges of the conduction band 510a and the valence band 510b, respectively. $E_i$ represents the intrinsic Fermi level. $E_{fm}$ and $E_{fs}$ represent the Fermi levels in the P+ Poly and the P-substrate, respectively. In FIG. 5, the energy bands 510 of the P-substrate 105 bend in the direction of higher electron energy (i.e. lower electrostatic potential) at the junction between the gate oxide layer 170 and the P-substrate 105.

Figure 6:
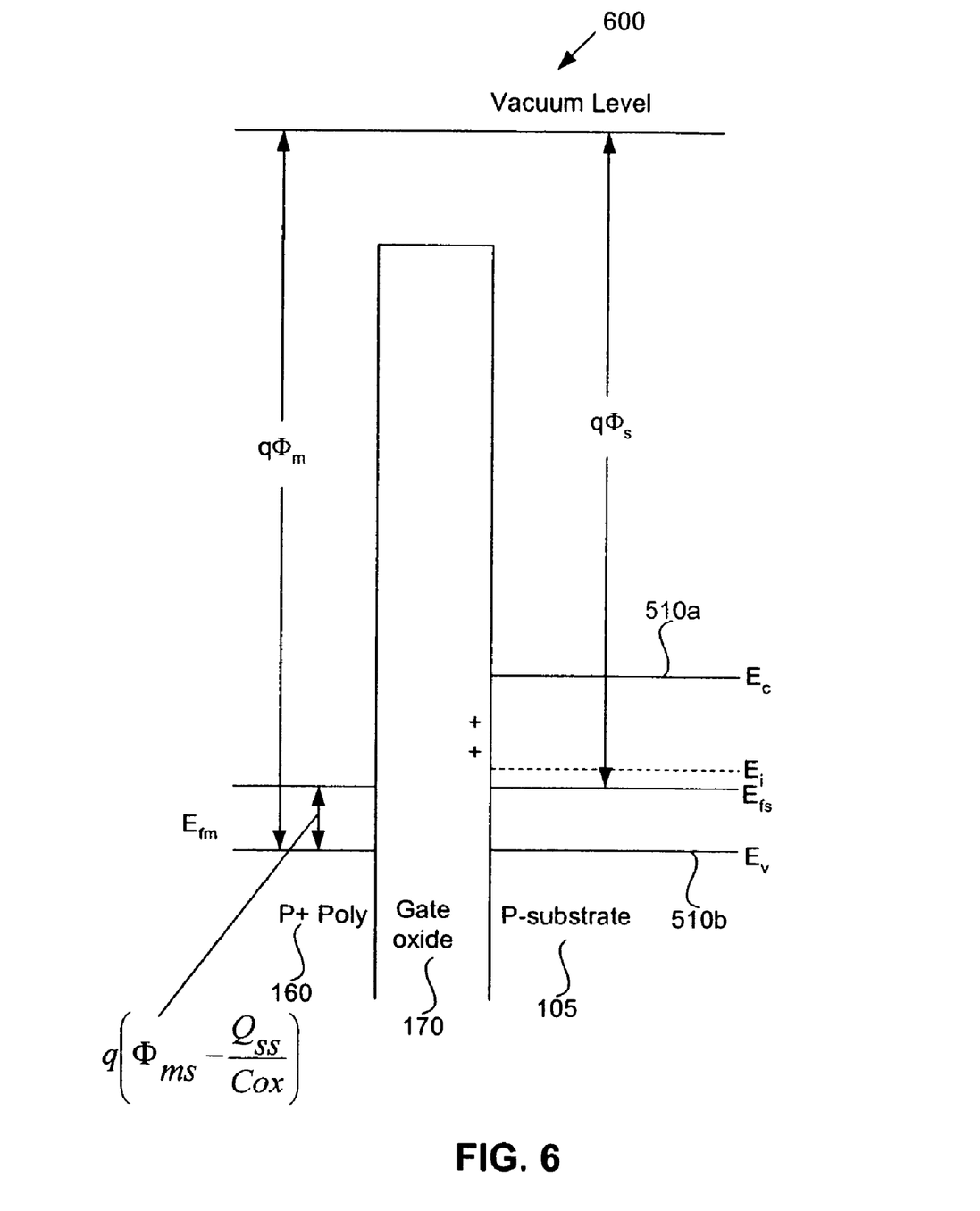
FIG. 6 illustrates a flatband condition of a native PMOS structure according to an embodiment of the present invention.

FIG. 6 illustrates a flatband condition of the native PMOS structure 100, 400 according to an embodiment of the present invention. For instance, applying a negative voltage at the gate 160 can flatten the energy bands 510, as shown in FIG. 6. According to an embodiment, a negative voltage at the gate 160 reduces the electron energy at the junction between the gate oxide layer 170 and the P-substrate 105.

The threshold voltage of a conventional PMOSFET can be expressed by $V_t = \Phi_{ms} - (Q_{SS}/C_{OX}) - (Q_B/C_{OX}) - 2\Phi_f$, where $\Phi_{ms} = \Phi_m - \Phi_s$. $\Phi_m$ is based on the type of material used for the gate 160, and $\Phi_s$ is based on the type of material used for the substrate 105. For example, referring back to FIGS. 1 and 4, the gate 160 is a P+ Polysilicon material, and the substrate 105 is P-type. $Q_{ss}$ represents the fixed charges in the gate oxide layer 170. $\Phi_{ms}$ and $Q_{ss}$ can be used to calculate the flat band voltage of the native PMOS structure 100. $C_{ox}$ represents the capacitance between the gate 160 and the P-substrate 105. In FIG. 6, q represents the charge of an electron and equals $1.602 \times 10^{-19}$ C.

$2\Phi_f$ represents the onset of inversion with respect to band bending. Inversion refers to the accumulation of charge at the surface of the substrate 105. For example, if charge is accumulated at the surface of the substrate 105, then the energy bands 510 typically bend upward or downward. If the energy bands 510 are flat, then charge is generally not accumulated at the surface of the substrate 105.

$Q_B$ represents the depletion charge contributed by the N-wells 120 at the onset of inversion. Because the wells are N-type in this example, $Q_B$ is a positive (i.e. donor-type) charge.

If the native PMOS structure 100, 400 includes halo implant regions 180, as shown in FIGS. 1 and 4, the threshold voltage is further based on the depletion charge $Q_h$ at the surface of the halo implant regions 180. For example, charge can accumulate at the interface between halo implant region 180a and the source 150a and/or halo implant region 180b and the drain 150b. Taking $Q_h$ into consideration, the threshold voltage can be represented by $V_t = \Phi_{ms} - (Q_{SS}/C_{OX}) - (Q_B/C_{OX}) - 2\Phi_f - (Q_h/C_{OX})$.

The native PMOS structure 100, 400 can have an N-well 120 that does not extend completely across the active region 155. As shown in FIGS. 1 and 4, the material beneath the gate oxide layer 170 can be P-substrate 105.

Charge $Q_{psub}$ from the P-substrate 105 can contribute to the threshold voltage, as indicated by $V_t = \Phi_{ms} - (Q_{SS}/C_{OX}) - (Q_B/C_{OX}) - 2\Phi_f - (Q_h/C_{OX}) + (Q_{psub}/C_{OX})$.

Referring to FIG. 1 for illustrative purposes, the $Q_{psub}$ and $Q_B$ charges generally dominate the threshold voltage calculation for a native PMOS structure 100 having a long channel 165. The threshold voltage of a long channel structure (e.g., a structure having a channel length of approximately 1 µm or greater) is, therefore, typically positive. For instance, the threshold voltage of a long channel structure can be approximately 300-500 mV. At the onset of inversion, most of the $Q_B$ charge is contributed by the deep N-well 110 because the N-wells 120 generally do not extend substantially into the active region.

Referring to FIG. 4, the $Q_h$ charge contributed by the halo implant regions 180 can have a more significant impact on the threshold voltage for a native PMOS structure 400 that has a short channel 165. For example, if the channel length is reduced, then $Q_B$ and $C_{OX}$ decrease, but $Q_h$ remains substantially the same. $Q_B$ and $C_{OX}$ are both area-dependent. In the embodiments of FIGS. 1 and 4, $Q_B$ and $C_{OX}$ are dependent on the area under the gate 160. As the area under the gate is reduced, $Q_B$ and $C_{OX}$ decrease proportionally. Thus, the ratio of $Q_B/C_{OX}$ does not vary substantially based on the channel length of the native PMOS structure 100, 400. As the channel length is reduced, the ratio of $Q_h/C_{OX}$ increases, because $Q_h$ remains substantially the same. However, as the channel length is reduced, the threshold voltage becomes less positive. In an embodiment, the native PMOS structure 400 has a threshold voltage of approximately zero volts.

Figure 7:
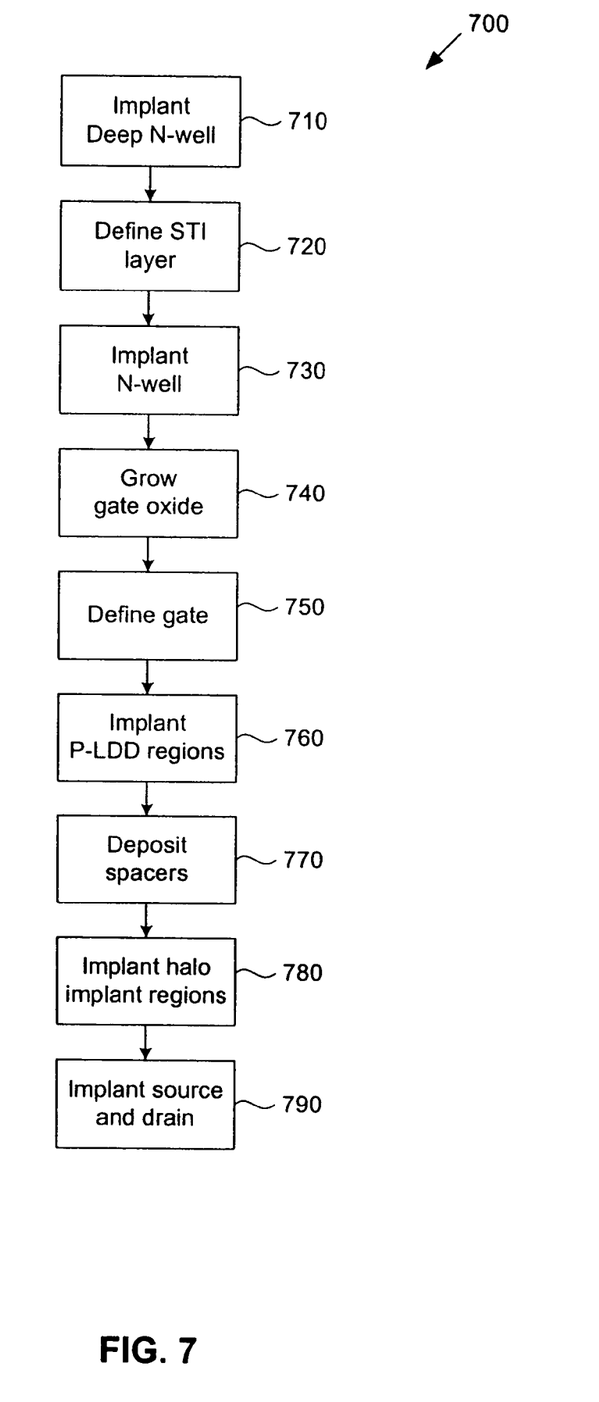
FIG. 7 illustrates a flow chart for a method of processing a native P-type metal oxide semiconductor (PMOS) structure according to an embodiment of the present invention.

FIG. 7 illustrates a flow chart for a method of processing a native P-type metal oxide semiconductor (PMOS) structure according to an embodiment of the present invention. The native PMOS structure 100, 400 can be fabricated using conventional CMOS processing, for example. According to an embodiment, the native PMOS structure 100, 400 can be fabricated without adding any masking steps or altering the process steps of a conventional PMOS fabrication process. Processing the native PMOS structure 100, 400 is generally no more costly than processing a conventional PMOS device.

A deep N-well 110 is implanted in the P-substrate 105 at block 710. For example, phosphorus or arsenic atoms can be accelerated into the P-substrate 105. A shallow trench isolation (STI) layer 115 is defined at block 720. For instance, the STI 115 can be etched to provide an opening for the isolation of active PMOS elements. According to an embodiment, the entire perimeter of the deep N-well 110 extends laterally beyond the perimeter of the opening. In an embodiment, the "tail" of the deep N-well 110 effects the charge concentration of the P-substrate 105. For example, phosphorus atoms from the deep N-well implantation at block 710 can form a lightly doped N-well in the P-substrate 105.

The N-wells 120 are implanted at block 730. Photoresist is generally placed over the P-substrate 105 and portions of the STI layer 115, though the scope of the invention is not limited in this respect. A mask is used to block light (e.g., ultraviolet light typically used in photolithography) from portions of the photoresist and to expose those portions that are not blocked by the mask. For a positive photoresist process, the exposed portions of the photoresist are removed by chemical etching, for example. For a negative photoresist process, the portions of the photoresist that are not exposed are removed. Phosphorus or arsenic atoms are implanted into the P-substrate in those areas not covered by photoresist to provide the N-wells 120. The remaining photoresist is then removed.

According to an embodiment, the N-wells 120 are in contact with the deep N-well 110. The N-wells 120 can represent a single N-well 120 having an inner perimeter. For instance, the entire perimeter of the deep N-well 110 can extend beyond the inner perimeter of the N-well 120.

The gate oxide layer 170 is grown at block 740. For example, the gate oxide 170 can be thermally grown in dry oxygen. The gate 160 is defined at block 750. Poly 160 is deposited on the gate oxide layer 170, and photoresist is generally deposited on the Poly layer 160. The photoresist is masked and exposed, and either exposed or unexposed portions of the photoresist are removed. The Poly layer 160 is typically etched in the regions where the photoresist is removed to define the gate length of the native PMOS structure 100, 400. The remaining photoresist is removed, and the remaining Poly layer 160 provides a gate contact for the native PMOS structure 100, 400.

The P-type lightly doped drain (P-LDD) regions 190 are implanted at block 760. For example, boron ions can be implanted into the P-type substrate to provide the P-LDD regions 190. The spacers 195 are deposited at block 770. The spacers 195 are typically dielectric material, formed of some type of nitride, such as $Si_3N_4$, or an oxide, such as $SiO_2$. The spacers 195 can be deposited using low-pressure chemical vapor deposition, for instance. The halo implant regions 180 are implanted at block 780. The halo implant regions 180 generally extend into the channel 165 beyond the P-LDD regions 190, as shown in FIGS. 1 and 4.

The source 150a and the drain 150b are implanted at block 790. For example, boron atoms can be accelerated into the halo implant regions 180 to provide the P+ regions 150. The implantation at block 790 can include doping the Poly layer 160 to provide the P+ Poly layer 160. For example, the implantation at block 790 can implant boron atoms in the source 150a, the drain 150b, and the Poly layer 160.

The native PMOS structure 100, 400 is generally thermally annealed to activate implanted dopants, such as boron, arsenic, or phosphorus atoms. The source 150a and the drain 150b can diffuse horizontally and/or vertically during thermal annealing. According to an embodiment, the halo implant regions 180 diffuse into each other to form an N-type region, as shown in FIG. 4.

Metallization is often placed on the P+ regions 150 and the P+ Poly layer 160. For example, the metallization can allow electrically conductive elements, such as wires, to be connected to the native PMOS structure 100, 400 without damaging the native PMOS structure 100, 400.

Figure 8:
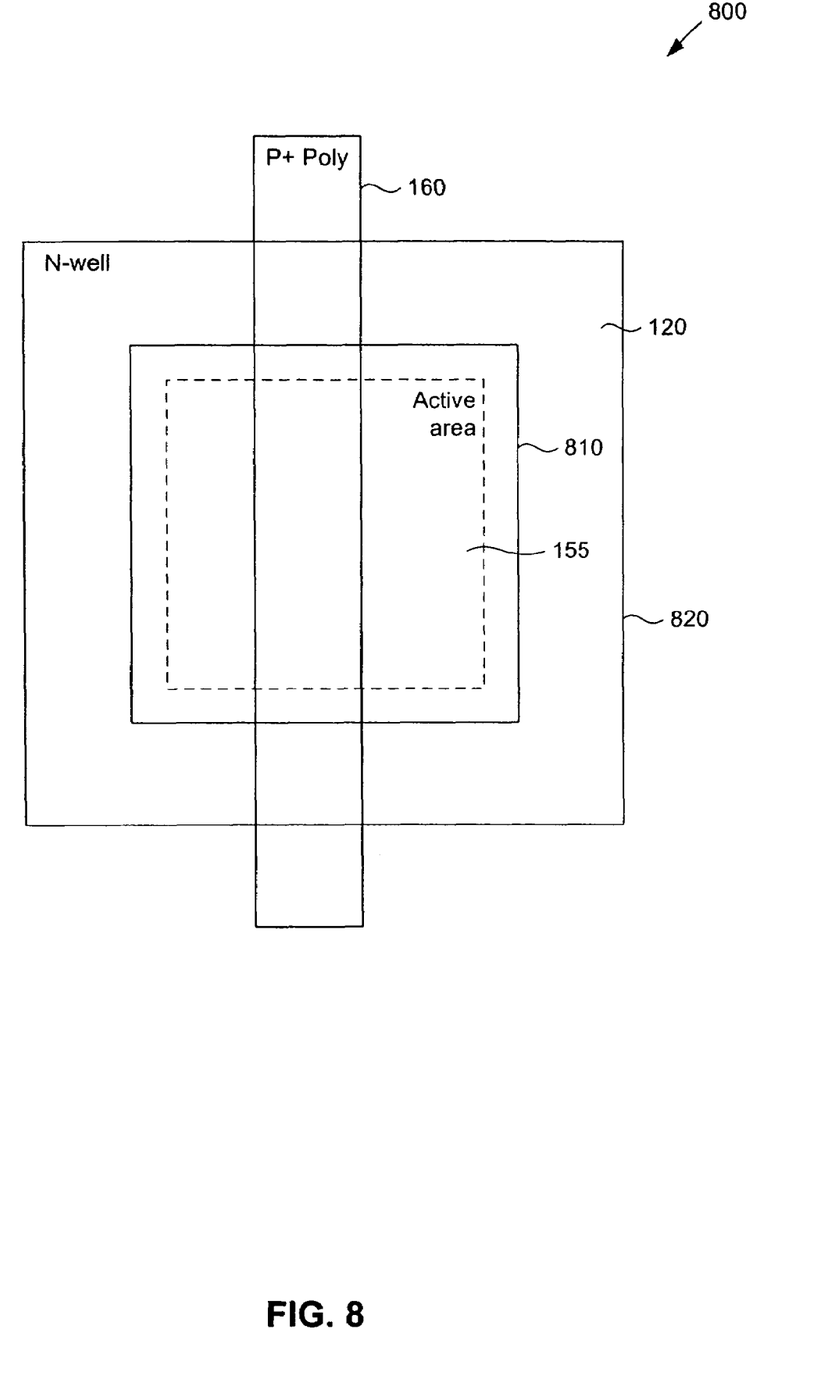
FIG. 8 illustrates a first exemplary configuration of a native PMOS structure according to an embodiment of the present invention.
Figure 9:
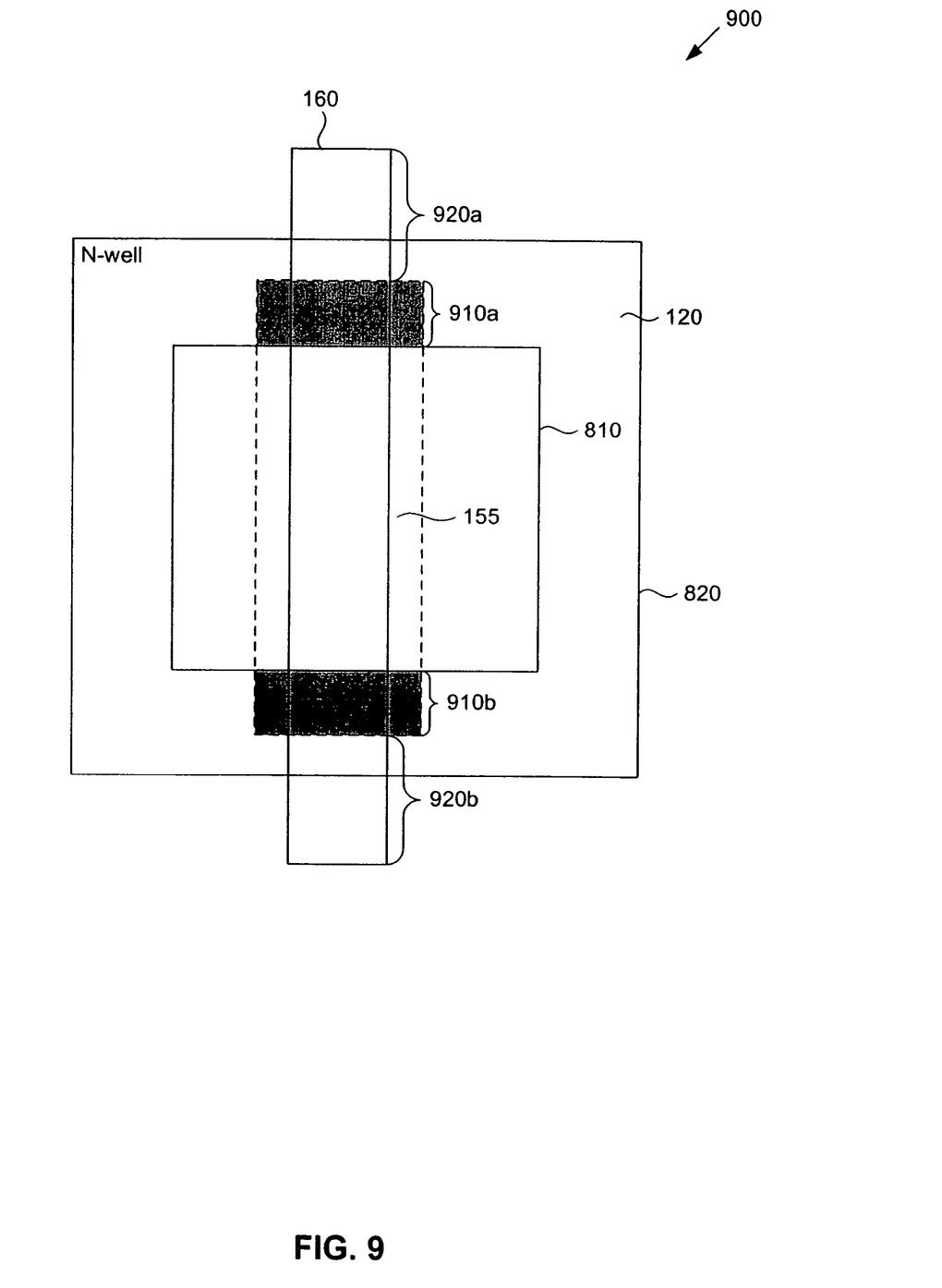
FIG. 9 illustrates a second exemplary configuration of a native PMOS structure according to an embodiment of the present invention.
Figure 10:
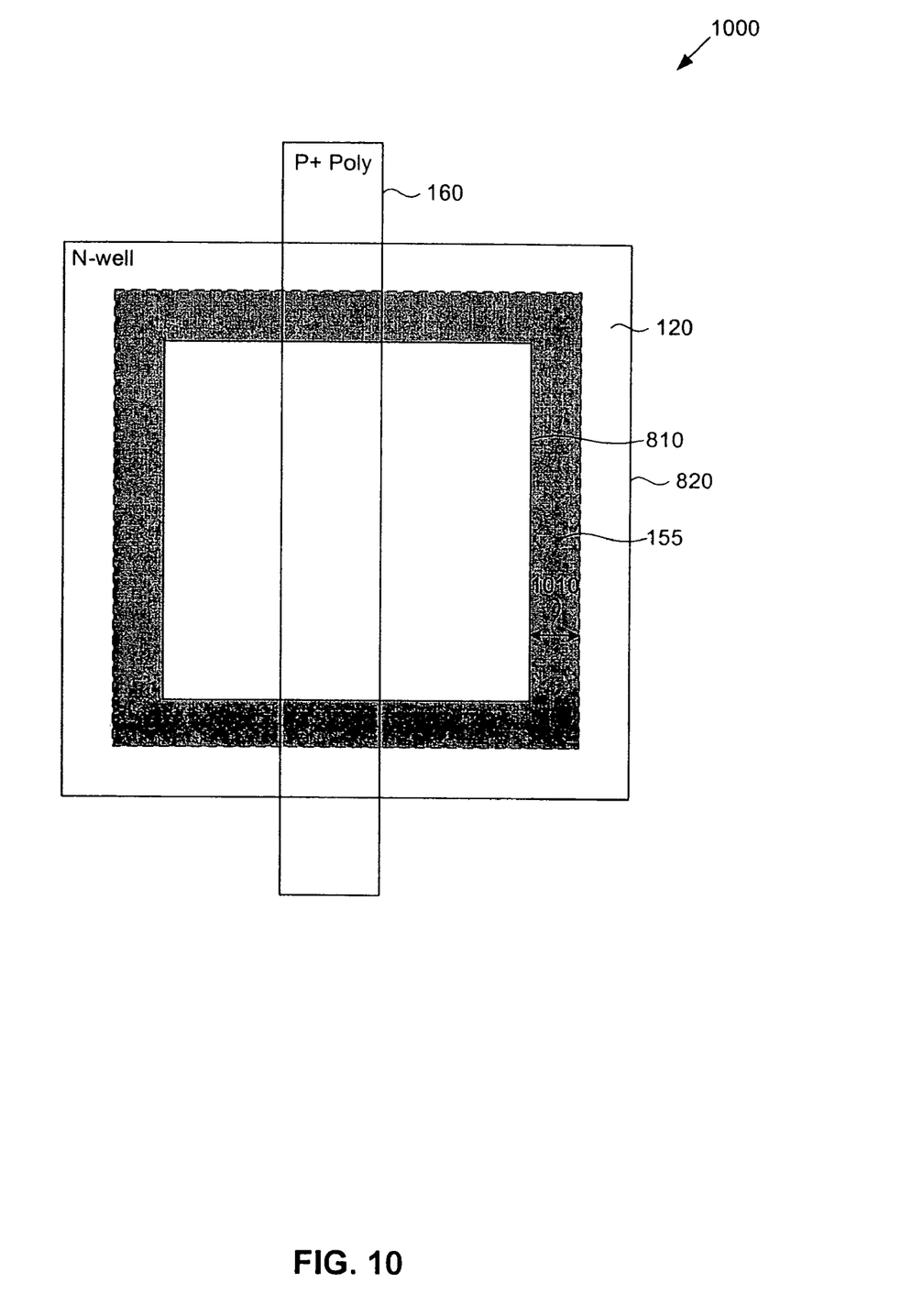
FIG. 10 illustrates a third exemplary configuration of a native PMOS structure according to an embodiment of the present invention.

The above processing steps are provided by way of example and not limitation. Persons having ordinary skill in the semiconductor processing art will readily envision alternative processing techniques to achieve the same structure based on the present disclosure FIGS. 8-10 show different exemplary configurations of a native PMOS structure according to embodiments of the present invention. In FIGS. 8-10, the N-well 120 has an inner perimeter 810 and an outer perimeter 820. Referring to FIG. 8, the active area 155 does not overlap the N-well 120. The inner perimeter 810 completely laterally surrounds the active area 155 in the two-dimensional representation of FIG. 8. For instance, providing the active area 155 within the inner perimeter 810 of the native PMOS structure 100, 400 can reduce the junction capacitance of the native PMOS structure 100, 400. For example, the configuration shown in FIG. 8 can correspond to the cross-sectional view of the native PMOS structure 100, 400 shown in FIG. 1 or FIG. 4, respectively. Referring to FIG. 1, for instance, N-well 120a does not extend beneath the source 150a and N-well 120b does not extend beneath the drain 150b In FIG. 9, the active region 155 overlaps the N-well 120 near the P+ Poly endcaps 920a and 920b, as indicated by the shaded overlapping regions 910a and 910b. For instance, overlapping the N-well 120 and the active region 155 near the P+ Poly endcaps 920a and 920b can reduce the source-to-drain leakage current. According to an embodiment, the configuration shown in FIG. 9 can correspond to the cross-sectional view of the native PMOS structure 100, 400 shown in FIG. 1 or FIG. 4, respectively In FIG. 10, the active region 155 overlaps the N-well 120 at all edges of the active region 155, as indicated by the shaded overlapping region 1010. For example, overlapping the N-well 120 and the active region 155 at all edges of the active region 155 can substantially reduce the leakage path between the source 150a and the drain 150b.

Conclusion

Example embodiments of the methods, systems, and components of the present invention have been described herein. As noted elsewhere, these example embodiments have been described for illustrative purposes only, and are not limiting. Other embodiments are possible and are covered by the invention. Such other embodiments will be apparent to persons skilled in the relevant art(s) based on the teachings contained herein. Thus, the breadth and scope of the present invention should not be limited by any of the above described exemplary embodiments, but should be defined only in accordance with the following claims and their equivalents.

What is claimed is:

1. A metal oxide semiconductor (MOS) device, comprising:
    an active region;
    a first region implanted into a semiconductor substrate coupled to the active region forming a drain;
    a second region implanted into the semiconductor substrate coupled to the active region forming a source, wherein the source is implanted with a substantially similar implant type as compared to the drain; and
    a first implant region in contact with the drain, wherein the first implant region is implanted with a substantially opposite implant type as compared to the drain, the first implant region more heavily implanted than a well that is attached to a portion of the active region.

2. The MOS device of claim 1, further comprising:
a second implant region in contact with the source, wherein the second implant region is implanted with the substantially opposite implant type as compared to the drain, the second implant region more heavily implanted than the well.

3. The MOS device of claim 2, wherein the first implant region is in contact with the second implant region.

4. The MOS device of claim 2, wherein the second implant region includes a second halo implant.

5. The MOS device of claim 1, wherein the drain is implanted with a p-type implant to form a first P+ region and the drain is implanted with the p-type implant to form a second P+ region.

6. The MOS device of claim 1, wherein the first implant region includes a first halo implant.

7. The MOS device of claim 1, wherein the well includes an inner perimeter and an outer perimeter, wherein the inner perimeter surrounds at least a portion of the active region.

8. The MOS device of claim 7, wherein the well is implanted with a n-type implant to form an N-well.

9. A metal oxide semiconductor (MOS) device, comprising:
an active region;
a well having an inner perimeter and an outer perimeter, wherein the inner perimeter surrounds at least a portion of the active region; and
a first implant region in contact with a drain, wherein the first implant region is implanted with a substantially similar implant type as compared to the well, the first implant region more heavily implanted than the well.

10. The MOS device of claim 9, further comprising:
a second implant region in contact with a source, wherein the second implant region is implanted with the with a substantially similar implant type as compared to the well, the second implant region more heavily implanted than the well.

11. The MOS device of claim 10, wherein the first implant region is in contact with the second implant region.

12. The MOS device of claim 10, wherein the second implant region includes a second halo implant.

13. The MOS device of claim 9, wherein the first implant region includes a first halo implant.

* * * * *

UNITED STATES PATENT AND TRADEMARK OFFICE
CERTIFICATE OF CORRECTION

PATENT NO. : 7,382,024 B2  Page 1 of 1
APPLICATION NO. : 11/648651
DATED : June 3, 2008
INVENTOR(S) : Ito et al.

It is certified that error appears in the above-identified patent and that said Letters Patent is hereby corrected as shown below:

Column 10, line 11, replace "implanted with the with a" with -- implanted with a --.

Signed and Sealed this

Twenty-third Day of December, 2008

JON W. DUDAS
*Director of the United States Patent and Trademark Office*